(12) United States Patent
Richardson

(10) Patent No.: US 8,493,474 B2
(45) Date of Patent: Jul. 23, 2013

(54) MEMORY-ENHANCED IMAGE SENSOR

(75) Inventor: Justin Richardson, Edinburgh (GB)

(73) Assignee: STMicroelectronics (R&D) Ltd., Marlow Bucks (GB)

( * ) Notice: Subject to any disclaimer, the term of this patent is extended or adjusted under 35 U.S.C. 154(b) by 1976 days.

(21) Appl. No.: 11/623,515

(22) Filed: Jan. 16, 2007

(65) Prior Publication Data

US 2007/0165443 A1 Jul. 19, 2007

(30) Foreign Application Priority Data

Jan. 17, 2006 (EP) .................................. 06250237

(51) Int. Cl.
*H04N 5/76* (2006.01)
(52) U.S. Cl.
USPC ....................................................... 348/231.9
(58) Field of Classification Search
USPC ............ 348/231.99, 372, 231.9, 308, 207.99, 348/345, 247, 373, 231.5, 273, 246, 222.1
See application file for complete search history.

(56) References Cited

U.S. PATENT DOCUMENTS

| | | | | |
|---|---|---|---|---|
| 5,550,587 | A * | 8/1996 | Miyadera | 348/223.1 |
| 6,778,212 | B1 * | 8/2004 | Deng et al. | 348/222.1 |
| 6,879,340 | B1 * | 4/2005 | Chevallier | 348/207.99 |
| 6,980,239 | B1 | 12/2005 | Motta | 348/211.6 |
| 7,409,564 | B2 * | 8/2008 | Kump et al. | 713/300 |
| 7,796,169 | B2 * | 9/2010 | Kitani | 348/247 |
| 2004/0021637 | A1 | 2/2004 | Ahn | 345/165 |
| 2004/0090533 | A1 | 5/2004 | Dow et al. | 348/220.1 |
| 2005/0134717 | A1 | 6/2005 | Misawa | 348/333.06 |
| 2005/0231617 | A1 * | 10/2005 | Kitani | 348/247 |
| 2006/0249809 | A1 * | 11/2006 | Lung | 257/530 |

FOREIGN PATENT DOCUMENTS

| | | |
|---|---|---|
| EP | 1143521 | 10/2001 |
| EP | 1143521 A1 * | 10/2001 |
| WO | WO2005/045516 | 5/2005 |

OTHER PUBLICATIONS

"Writing Relocatable Code", The Ganssle Group, Sep. 1, 2000, XP002390202, available at www.ganssle.com/articles/arelocat.htm.

* cited by examiner

*Primary Examiner* — Tuan Ho
*Assistant Examiner* — Ahmed A Berhan
(74) *Attorney, Agent, or Firm* — Allen, Dyer, Doppelt, Milbrath & Gilchrist, P.A.

(57) ABSTRACT

An image sensor IC may have a non-volatile memory for several functions. The functions may include storing control parameters for a camera autofocus module, part tracking data, and data for defect correction or color science. The non-volatile memory can in particular be an antifuse non-volatile memory, which may not need special light shielding.

33 Claims, 2 Drawing Sheets

MEMORY-ENHANCED IMAGE SENSOR

FIELD OF THE INVENTION

The present invention relates to a memory enhanced image sensor, in particular to a digital image sensor with integrated memory functions.

BACKGROUND OF THE INVENTION

A digital image sensor is a semiconductor device comprising an array of pixels, each of which comprises a photosensitive element (e.g. a photodiode) for converting incident light into a photocurrent. The generated photocurrent is gathered for an exposure time before being converted to a voltage, digitized and read out. Different architectures of digital image sensor are defined by the processes used in their manufacture. Two of the most common types of digital image sensor are the charge coupled device (CCD) and the Complementary Metal Oxide Semiconductor (CMOS) image sensor. CMOS image sensors are particularly applicable for applications which require low power operation at low cost.

A digital image sensor is formed as an integrated circuit (IC), and an imaging device typically comprises the digital image sensor IC together with optical components (e.g. a lens) and other device components.

A digital image sensor comprises a number of well known volatile memory components, i.e. memory components that only maintain the stored data for as long as a power supply is maintained In particular, for a CMOS sensor, each pixel comprises capacitors which store charge for subsequent readout. The readout operation is controlled with vertical and/or horizontal shift registers. Line memories are required for functions such as analog to digital conversion (ADC), digital filters, and defect correction algorithms. A frame store can be provided which stores image data for correlated double sampling or for schemes which combine images to extend dynamic range. This is not an exhaustive list of the types of volatile memory, or of the uses to which each is put.

For the permanent storage of data, non-volatile memory is used. Non-volatile memories are typically used in read-only memory (ROM), flash memory, magnetic computer storage devices such as hard disks, floppy disk drives, or in optical disc drives Most non-volatile memory cells rely on a trapped charge stored on a floating gate in a field effect transistor (FET), and so the contents of the memory are erased if exposed to incident light. Because of this, non-volatile memory is not generally thought of as being suitable for use with an image sensor. If any extra memory storage is required for a given image sensing device, the non-volatile memory needs to be stored on a separate IC, remote from the image sensor IC. The use of a multiple chipset package increases the size and manufacturing costs of an image sensing device. U.S. Pat. No. 6,879,340 to Chevallier discloses a CMOS image sensor that incorporates a non-volatile memory, which is used as a frame store. In order to enable the use of a non-volatile memory, the disclosure of Chevallier provides a layer of opaque protective material which covers the non-volatile memory. This represents an extra processing step during sensor manufacture, and an increase in manufacturing complexity such as this increases the time of manufacture and decreases device yield and so from a cost and profitability perspective the avoidance of this step is desirable.

As described above, volatile memory is commonly used in image sensors for the performance of the sensor's image processing tasks U.S. Pat. No. 6,879,340 to Chevallier discloses an image sensor IC which comprises a non-volatile memory which is also used for the sensor's image processing tasks. There is a need for a non-volatile memory provided on an image sensor IC which can perform other tasks.

SUMMARY OF THE INVENTION

According to a first aspect of the present invention, there is provided an image sensor integrated circuit (IC) comprising an antifuse non-volatile memory. The IC further may comprise a volatile memory means or a volatile memory, for mapping, or a mapper, the contents of the non-volatile memory to the volatile memory means. The volatile memory means may comprise an I2C data bus space. The IC may further comprise a switcher for selectively powering the antifuse non-volatile memory. The switcher is arranged to power the antifuse non-volatile memory upon power-up of the IC and to switch off the antifuse non-volatile memory when its contents have been copied to the volatile memory.

Furthermore, the antifuse non-volatile memory is encoded with data for part-tracking. The data for part-tracking may comprise at least one of: sensor ID, date of manufacture, sales region ID, tester ID, test result, wafer ID, and die ID. The antifuse non-volatile memory may be encoded with data for defect correction of image data. The data for defect correction comprise the locations of defective pixels. The data for defect correction may comprise couplet locations. The antifuse non-volatile memory may be encoded with data for color filter array reconstruction. The data for color filter array reconstruction may comprise at least one of: data for anti-vignetting, color channel gains, range scaling parameters, demosaicing algorithms, range clipping parameters, and gamma correction data. The antifuse non-volatile memory may be encoded with data defining embedded firmware for microprocessor or DSP control.

According to a second aspect of the invention, there is provided an imaging apparatus comprising the IC of the first aspect, together with a co-processor associated therewith. The imaging apparatus may further comprise an auxiliary device connected to at least one of the IC or the co-processor. The auxiliary device may comprise a motor for driving a lens carriage, and the antifuse non-volatile memory may be encoded with operational parameters for driving the motor. The motor may comprise a piezoelectric motor. The imaging apparatus may further comprise a lens position sensor arranged in feedback with the motor. The operational parameters may comprise one or more of a first command signal frequency for driving the motor in a first direction, a second command signal frequency for driving the motor in a second direction, and a hard-stop lens position defining an infinity focus.

According to a third aspect, there is provided a mobile (cellular) telephone comprising the imaging apparatus of the second aspect. According to a fourth aspect, there is provided an optical mouse comprising the imaging apparatus of the second aspect. According to a fifth aspect, there is provided a webcam comprising the imaging apparatus of the second aspect. According to a sixth aspect, there is provided an imaging apparatus comprising an IC comprising a non-volatile memory, a co-processor associated with said IC, and a motor for driving a lens carriage connected to at least one of the IC or the co-processor; characterized in that the non-volatile memory is encoded with operational parameters for driving the motor. The motor may comprise a piezoelectric motor. The imaging apparatus may further comprise a lens position sensor arranged in feedback with the motor. The operational parameters comprise one or more of a first command signal frequency for driving the motor in a first direction, a second command signal frequency for driving the motor in a second direction, and a hard-stop lens position defining an infinity focus. The non-volatile memory may be an antifuse non-volatile memory.

According to a seventh aspect, there is provided an image sensor integrated circuit (IC) comprising a non-volatile memory which is encoded with data for part-tracking. The data for part-tracking may comprise at least one of: sensor ID, date of manufacture, sales region ID, tester ID, test result, wafer ID, and die ID. The non-volatile memory may be an antifuse non-volatile memory.

According to a eighth aspect, there is provided an image sensor integrated circuit (IC) comprising a non-volatile memory which is encoded with data for defect correction of image data.

The data for defect correction may comprise the locations of defective pixels.

The data for defect correction may comprise couplet locations. The non-volatile memory may be an antifuse non-volatile memory.

According to a ninth aspect, there is provided an image sensor integrated circuit (IC) comprising a non-volatile memory which is encoded with data for color filter array reconstruction. The data for color filter array reconstruction may comprise at least one of: data for anti-vignetting, color channel gains, range scaling parameters, demosaicing algorithms, range clipping parameters, and gamma correction data. The non-volatile memory may be an antifuse non-volatile memory.

According to a tenth aspect, there is provided an image sensor integrated circuit (IC) comprising a non-volatile memory which is encoded with data defining embedded firmware for microprocessor or DSP control. The non-volatile memory may be an antifuse non-volatile memory.

It is to be appreciated that the embodiments of the sixth to tenth aspects can also include any of the features listed above as being properties of the first aspect, and can be incorporated with an image sensing apparatus that comprises any of the features of the second aspect.

BRIEF DESCRIPTION OF THE DRAWINGS

The present invention will now be described, by way of example only, with reference to the accompanying drawings, in which.

DETAILED DESCRIPTION OF THE PREFERRED EMBODIMENTS

Figure 1:
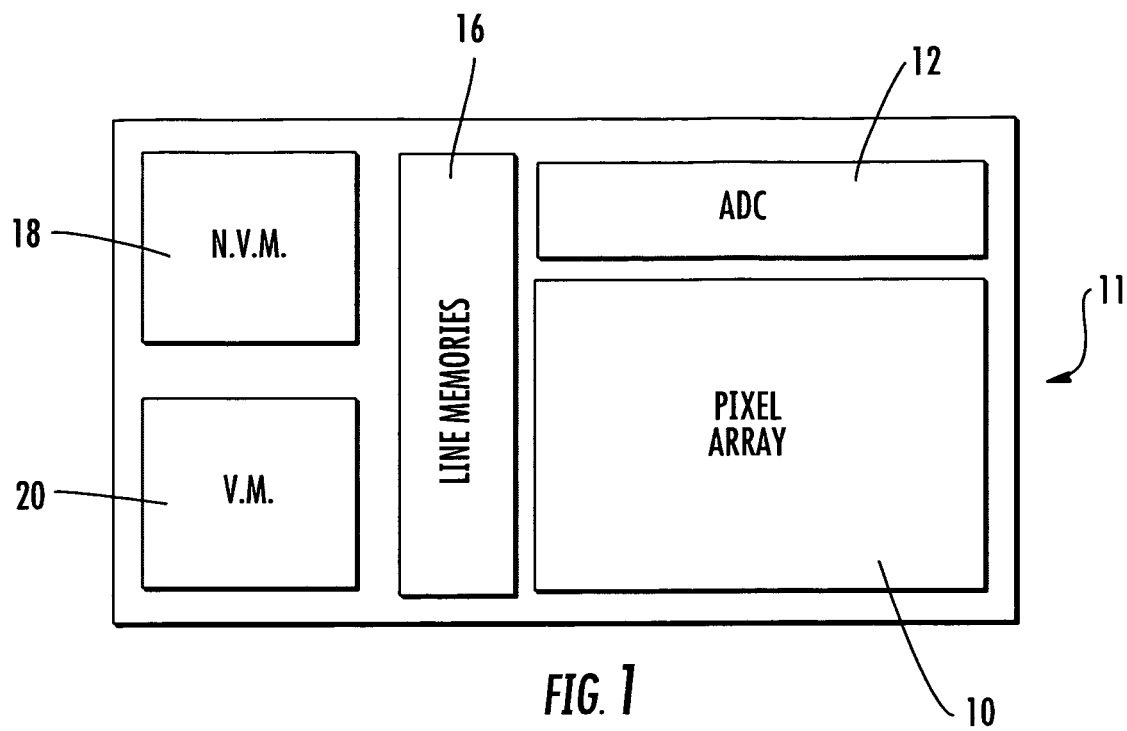
FIG. 1 shows how selected components are implemented on a digital image sensor IC according to a first embodiment of the invention.

Referring to FIG. 1, a digital image sensor IC 11 comprises an image sensing pixel array 10, analog to digital conversion means (ADC) 12 and a number of line memories 16, each of which functions in a well known manner. The IC 11 is further provided with a non-volatile memory 18 which functions as described below.

It is to be noted that the IC 11 illustrated in FIG. 1 is for the purposes of illustration only, and that the scope of the invention is in no way intended to be limited to any one particular design of IC. The arrangement and sizes of the various components may vary arbitrarily.

In a first preferred embodiment, the non-volatile memory 18 is an antifuse non-volatile memory. An antifuse memory component employs a non-conducting barrier of amorphous material which is sandwiched between two conductors. When a sufficiently high voltage is applied across the non-conducting barrier, it is converted to a conductor, so forming an electrical connection. Suitable materials for forming a non-volatile memory antifuse are amorphous silicon sandwiched between two metal conductors. When the higher voltage is applied, the amorphous silicon is converted to a polycrystalline silicon-metal alloy, which is conductive. Other materials with suitable properties may be used as the insulator or conductor in an antifuse.

Antifuse non-volatile memories are known in products such as programmable logic devices (PLD's), PROMS and digital storage products, such as MMC cards. The common link between these devices is that they are used as dedicated "memory" chips, that is, IC's that have the sole or primary function of acting as memory storage devices.

However, because an antifuse non-volatile memory does not rely on a trapped charge stored on an FET floating gate, the memory elements do not need to be shielded from incident light. This means that an antifuse non-volatile memory, traditionally used for dedicated memory storage IC's, can be used as part of an image sensing IC, without having to make special provisions for shielding the memory elements.

An on-chip non-volatile memory 18 (either a shielded floating gate non-volatile memory or an antifuse non-volatile memory) can be used for a number of purposes, which will now be discussed.

Figure 2:
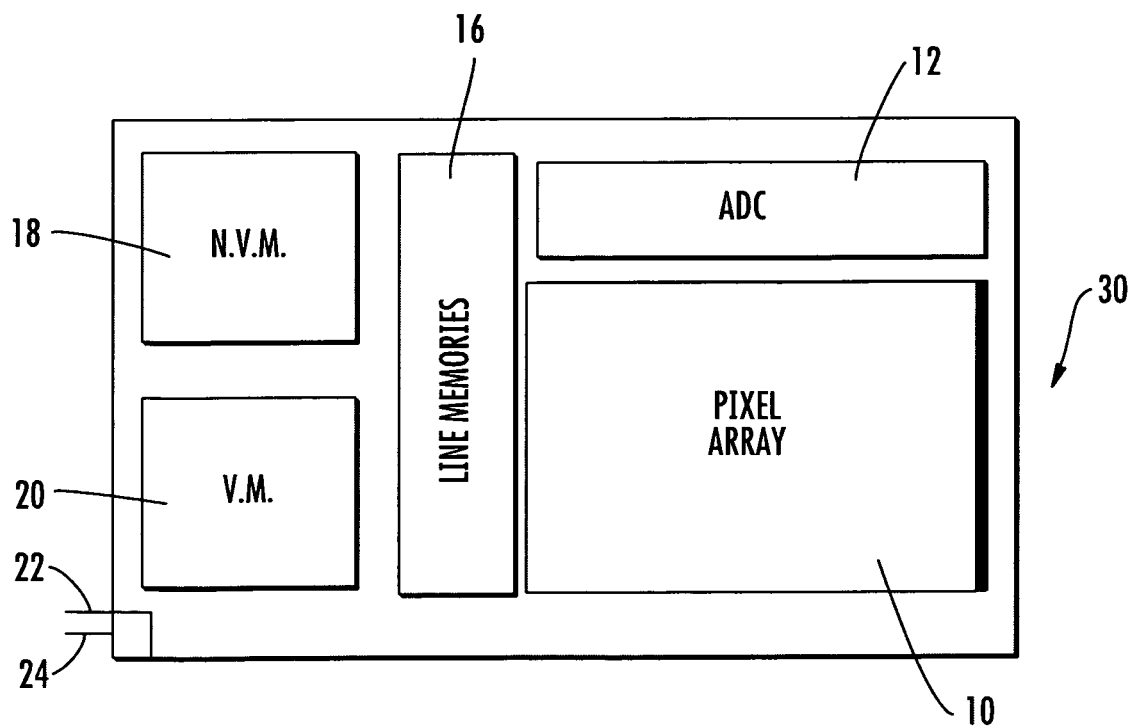
FIG. 2 shows how selected components are implemented on a digital image sensor IC according to a second embodiment of the invention.

FIG. 2 illustrates an IC 30 according to a second preferred embodiment, wherein components shared between the IC 30 and the IC 11 of FIG. 1 are illustrated with like reference numerals.

In the IC 30, the contents of the non-volatile memory 18 can be copied to a volatile memory 20. The volatile memory 20 defines a data bus space where the contents of the non-volatile memory 18 can be mirrored, by mapping into the appropriate register and data space. FIG. 2 illustrates an inter-integrated circuit ($I^2C$) space, which reads from and/or writes to serial data (SDA) and serial clock (SCL) pins 22, 24. It will be appreciated that different types of data buses may require or define different pin configurations. Furthermore, the data in the non-volatile memory 18 can be mapped into a volatile memory 20 for use with any type of data bus, as chosen by the manufacture. The SMIA specification defines a common camera interface (CCI), which provides a manufacturer with the option to define his own register functions.

In a preferred method of operation, the contents of the non-volatile memory 18 are copied into the volatile memory 20 at each power-on of the device. Thus, the data stored in the non-volatile memory 18 can be readily read and overwritten while always safely retaining the original contents on the non-volatile memory. This configuration also means that there is no need to exercise the non-volatile memory 18 during subsequent device operation and so it may be configured into a low power state so enhancing platform battery life. The speed of access to the relevant data is also improved, as the volatile memory 20 can be read from more quickly than the non-volatile memory 18, due to the non-volatile memory's serial shifting and access routines.

Figure 3:
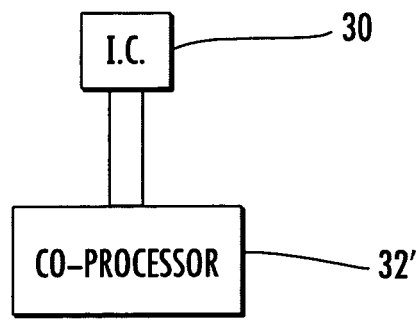
FIG. 3 illustrates schematically an embodiment of an image sensing device of the invention.

The availability of the data in a volatile format enables a closed loop control to be implemented. FIG. 3 shows an embodiment where the IC 30 of FIG. 2 is connected to a co-processor 32 which operates for the control functions of an image sensing device. On power up of the system, the sensor maps the contents of the non-volatile memory 18 to the volatile memory 20. The co-processor 32 can read the data and write a copy of the data back into a different region of the volatile memory 20 in order to change the functionality of the system. That is, the co-processor 32 can be used to change the software or firmware processing tasks of a system linked to the digital image sensor chip 30.

Figure 4:
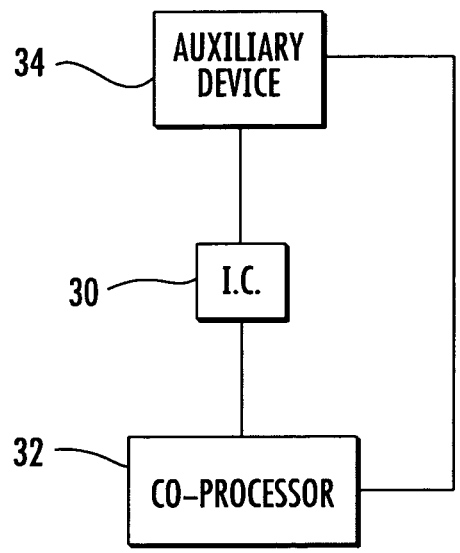
FIG. 4 shows schematically a further embodiment of an image sensing device of the invention.

The closed loop control can be used to set the operating parameters of an auxiliary device 34, as shown in FIG. 4. The non-volatile memory 18 can define a number of registers in the volatile memory 20 to represent the operational parameters of an auxiliary device 34, and the co-processor 32 can obtain the data from the auxiliary device 34 to be fed back into the volatile memory 20 so that command signals for the operation of the auxiliary device 34 are interpreted in the correct manner for operation of the auxiliary device. In this way, the non-volatile memory 18 provides a generic foundation for the operation of different types of auxiliary devices, for example, those from different manufacturers, therewith.

The "auxiliary device" may be any device which has a functional interdependence with the image sensor 30 or the output thereof. It could for example be a mechanical component, an optical element, or an electrical circuit, any of which has a function in the formation or presentation of an image to a user.

Some of the specific uses of a memory enhanced image sensor will now be discussed.

Firstly, the auxiliary device 34 shown in FIG. 4 may be an actuator for moving a lens carrier to adjust the focus of an optical imaging assembly which comprises the digital sensor IC as the image capturing element. Such an actuator may take the form of a piezoelectric motor. The piezoelectric motor is driven by command signals that are pulse width modulated according to specific frequencies. These command frequencies can be encoded on the non-volatile memory 18. In such a motor, the number of command pulses may not dependably correlate with a set variation in distance moved—this motion is not strictly linear, and may also vary according to different temperatures, data transmission errors, or positioning tolerances. The initial position of the lens carrier may also introduce an uncertainty. To deal with this, a lens position sensor forms part of the autofocus system control loop. It is proposed that the required ADC gains and/or offsets required for conversion of the fed back voltage are encoded into the non-volatile memory 18. The hard stop position of the lens, which corresponds to an infinity focus, can also be encoded in the non-volatile memory 18.

The non-volatile memory 18 can also be used for part tracking. Data such as the sensor ID, manufacturing data for traceability, day, year, sales region id, tester, test result (pass/fail), and even wafer and individual die references can be encoded into the non-volatile memory 18. This enables the origin of a chip to be tracked to a high degree of accuracy, which is useful for tracing the origin of faults or for investigating the history of chips which have been illegally re-sold or imported.

Another use of the non-volatile memory 18 is for defect correction. One particular problem in defect correction is the occurrence of couplet defects, that is, neighboring pixels in the pixel array or in the color domain that exhibit defective pixel values. Couplets are difficult to deal with using regular defect correction algorithms, as a first defective pixel is typically used as one of the inputs to correct for the defect in a second defective pixel, giving an inaccurate result. However, the X,Y positions of couplets can be encoded into the non-volatile memory 18. This allows for a downstream defect correction map based algorithm to be implemented (as opposed to an on the fly algorithm). Locations of any other types of defects may also be stored in the non-volatile memory 18.

The non-volatile memory 18 can also be used for color science purposes. For example, anti-vignetting data to correct for lens shadowing effects, color matrices which correct for the differing photon transmission differences between the three color filter materials in a color filter array, and setup data for statistics gathering such as color channel gains for white balancing could be encoded into the non-volatile memory 18.

The non-volatile memory 18 can also be used to encode embedded firmware for microprocessor or DSP control. When an antifuse non-volatile memory 18 is used, the memory elements which have not been "popped" provide a measure of reprogramming capability. Various improvements and modifications can be made to the above without departing from the scope of the invention.

That which is claimed:

1. An electronic device comprising:
   a substrate;
   a volatile memory on said substrate;
   an antifuse non-volatile memory on said substrate;
   an image sensing pixel array on said substrate; and
   a co-processor configured to
      write contents of said antifuse non-volatile memory to said volatile memory, the contents including operational parameters of the electronic device, and
      re-write the contents back into a different region of said volatile memory.

2. The image sensor IC of claim 1, further comprising a volatile memory and mapper for mapping contents of said antifuse non-volatile memory to said volatile memory.

3. The image sensor IC of claim 2, wherein said volatile memory comprises an $I^2C$ data bus.

4. The image sensor IC of claim 1, further comprising a switcher for selectively powering said antifuse non-volatile memory.

5. The image sensor IC of claim 4, wherein said switcher is arranged to power said antifuse non-volatile memory upon power-up and to switch off said antifuse non-volatile memory when its contents have been copied to said volatile memory.

6. The image sensor IC of claim 1, wherein said antifuse non-volatile memory is encoded with data for part-tracking.

7. The image sensor IC of claim 6, wherein the data for part-tracking comprises at least one of:
   sensor ID, date of manufacture, sales region ID, tester ID, test result, wafer ID, and die ID.

8. The image sensor IC of claim 1, wherein said antifuse non-volatile memory is encoded with data for defect correction of image data.

9. The image sensor IC of claim 8, wherein the data for defect correction comprises locations of defective pixels.

10. The image sensor IC of claim 8, wherein the data for defect correction comprises couplet locations.

11. The image sensor IC of claim 1, wherein said antifuse non-volatile memory is encoded with data for color filter array reconstruction.

12. The image sensor IC of claim 11, wherein the data for color filter array reconstruction comprises at least one of: data for anti-vignetting, color channel gains, range scaling parameters, demosaicing algorithms, range clipping parameters, and gamma correction data.

13. The image sensor IC of claim 1, wherein said antifuse non-volatile memory is encoded with data defining embedded firmware for microprocessor or DSP control.

14. The image sensor IC of claim 1, further comprising a processor coupled to said image sensor IC.

15. An electronic device comprising:
an image sensor integrated circuit (IC) including
a substrate,
a volatile memory on said substrate;
an antifuse non-volatile memory on said substrate, and
an image sensing pixel array on said substrate; and
a co-processor coupled to said image sensor IC and configured to
write contents of said antifuse non-volatile memory to said volatile memory, the contents including operational parameters of the image sensor IC, and
re-write the contents back into a different region of said volatile memory.

16. The electronic device of claim 15, further comprising an auxiliary device connected to at least one of said image sensor IC and said co-processor.

17. The electronic device of claim 16, wherein said auxiliary device comprises a motor for driving a lens carriage, and said antifuse non-volatile memory is encoded with operational parameters for driving said motor.

18. The electronic device of claim 17, wherein said motor comprises a piezoelectric motor.

19. The electronic device of claim 17, further comprising a lens position sensor arranged in feedback with said motor.

20. The electronic device of claim 17, wherein the operational parameters for driving said motor comprise at least one of a first command signal frequency for driving the motor in a first direction, a second command signal frequency for driving the motor in a second, direction, and a hard-stop lens position defining an infinity focus.

21. The electronic device of claim 15, wherein said electronic device defines at least one of an optical mouse, a web camera, an imaging apparatus, and a mobile telephone.

22. An electronic device comprising:
a co-processor;
an image sensor integrated circuit (IC); and
a motor for driving a lens carriage and coupled to at least one of said co-processor and said image sensor IC;
said image sensing IC including a non-volatile memory encoded with operational parameters for driving said motor, and a volatile memory;
said co-processor configured to
write contents of said non-volatile memory to said volatile memory, the contents including operational parameters of the image sensor IC, and
re-write the contents back into a different region of said volatile memory.

23. The electronic device of claim 22, wherein said electronic device defines at least one of an optical mouse, a web camera, an imaging apparatus, and a mobile telephone.

24. The electronic of claim 22, wherein said motor comprises a piezoelectric motor.

25. The electronic device of claim 22, further comprising a lens position sensor arranged in feedback with said motor.

26. The electronic device of claim 22, wherein the operational parameters for driving said motor comprise one or more of a first command signal frequency for driving the motor in a first direction, a second command signal frequency for driving the motor in a second direction, and a hard-stop lens position defining an infinity focus.

27. The electronic device of claim 22, wherein the non-volatile memory comprises an antifuse non-volatile memory.

28. A method of operating an image sensor integrated circuit (IC) comprising a substrate, a volatile memory on the substrate, an antifuse non-volatile memory on the substrate, and an image sensing pixel array on the substrate, the method comprising:
writing the contents of the antifuse non-volatile memory to a volatile memory, the contents including operational parameters of the image sensor IC;
selectively powering the antifuse non-volatile memory; and
re-writing the contents back into a different region of said volatile memory.

29. The method of claim 28, further comprising powering up the antifuse non-volatile memory upon power-up of the image sensor IC.

30. The method of claim 28, further comprising powering down the antifuse non-volatile memory when it contents have been mapped to the volatile memory.

31. The method of claim 28, further comprising encoding the antifuse non-volatile memory with data for at least one of part-tracking, defect correction of image data, and color filter array reconstruction.

32. The method of claim 31, wherein the data for defect correction comprises locations of defective pixels.

33. The method of claim 31, wherein the data for defect correction comprises couplet locations.

* * * * *